(12) United States Patent
Wang et al.

(10) Patent No.: US 8,471,156 B2
(45) Date of Patent: *Jun. 25, 2013

(54) METHOD FOR FORMING A VIA IN A SUBSTRATE AND SUBSTRATE WITH A VIA

(75) Inventors: Meng-Jen Wang, Kaohsiung (TW);
Kuo-Pin Yang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 606 days.

This patent is subject to a terminal disclaimer.

(21) Appl. No.: 12/583,949

(22) Filed: Aug. 28, 2009

(65) Prior Publication Data

US 2011/0048788 A1   Mar. 3, 2011

(51) Int. Cl.
*H05K 1/11* (2006.01)

(52) U.S. Cl.
USPC ........................................................ 174/262

(58) Field of Classification Search
USPC ... 174/261; 438/637, 639, 667, 672; 257/680, 257/698, 700, 758, E21.597; 361/773
See application file for complete search history.

(56) References Cited

U.S. PATENT DOCUMENTS

| | | | |
|---|---|---|---|
| 5,308,443 A | 5/1994 | Sugihara | |
| 5,998,292 A | 12/1999 | Black et al. | |
| 6,700,175 B1 | 3/2004 | Kodama et al. | |
| 6,809,421 B1 | 10/2004 | Hayasaka et al. | |
| 7,222,420 B2 | 5/2007 | Moriizumi | |
| 7,276,787 B2 | 10/2007 | Edelstein et al. | |
| 7,772,116 B2 | 8/2010 | Akram et al. | |
| 2003/0176058 A1 | 9/2003 | Weidman et al. | |
| 2004/0259292 A1 | 12/2004 | Beyne et al. | |
| 2006/0001174 A1 | 1/2006 | Matsui | |
| 2006/0118965 A1 | 6/2006 | Matsui | |
| 2006/0281307 A1 | 12/2006 | Trezza | |
| 2007/0048896 A1 | 3/2007 | Andry et al. | |
| 2007/0184654 A1 | 8/2007 | Akram et al. | |
| 2008/0041621 A1* | 2/2008 | Hsu et al. ....................... | 174/262 |
| 2008/0164573 A1 | 7/2008 | Basker et al. | |

FOREIGN PATENT DOCUMENTS

| | | |
|---|---|---|
| CN | 1684256 | 10/2005 |
| CN | 101281883 | 10/2008 |
| JP | 2005219588 | 8/2005 |
| JP | 2007036060 | 2/2007 |
| TW | 200416897 | 9/2004 |
| TW | 200501386 | 1/2005 |
| TW | I239594 | 9/2005 |
| TW | 200707667 | 2/2007 |

(Continued)

OTHER PUBLICATIONS

Office Action in U.S. Appl. No. 12/183,140 dated Mar. 8, 2010.

(Continued)

*Primary Examiner* — Jeremy Norris
*Assistant Examiner* — Tremesha S Willis
(74) *Attorney, Agent, or Firm* — McCracken & Frank LLC

(57) ABSTRACT

The present invention relates to a method for forming a via in a substrate and a substrate with a via. The method includes the following steps: (a) providing a substrate; (b) forming a groove on a first surface of the substrate; (c) forming a conductive metal on the groove so as to form a central groove; (d) forming an annular groove that surrounds the conductive metal; (e) forming an insulating material in the central groove and the annular; groove; and (f) removing part of the substrate to expose the conductive metal and the insulating material.

18 Claims, 18 Drawing Sheets

FOREIGN PATENT DOCUMENTS

| | | |
|---|---|---|
| TW | 200715438 | 4/2007 |
| TW | I278263 | 4/2007 |
| TW | 200926259 | 6/2009 |

OTHER PUBLICATIONS

Office Action in U.S. Appl. No. 12/241,219 dated Jan. 13, 2011.
Office Action dated Jan. 4, 2012, with abstract for CN Patent Application No. 2010101444216.7 (8 pages).
United States Patent Office Final Office Action issued Jul. 11, 2012 for U.S. Appl. No. 13/085,311, Applicants, Meng-Jen Wang et al. (18 pages).
TIPO Office Action dated Apr. 10, 2013 for counterpart TW Patent Applicantion No. 098146109. Applicant Advanced Semiconductor Engineering, Inc., with English translation (7 pages).

* cited by examiner

METHOD FOR FORMING A VIA IN A SUBSTRATE AND SUBSTRATE WITH A VIA

BACKGROUND OF THE INVENTION

1. Field of the Invention

The present invention relates to a method for forming a via in a substrate and a substrate with a via, and more particularly to a method for forming an insulating layer on a side wall of a via in a substrate and a substrate with a via.

2. Description of the Related Art

FIGS. 1 to 3 show schematic views of a conventional method for forming a via in a substrate. First, referring to FIG. 1, a substrate 1 is provided. The substrate 1 has a first surface 11 and a second surface 12. Then, a plurality of grooves 13 are formed on the first surface 11 of the substrate 1. An insulating layer 14 is then formed on the side wall of the grooves 13 by chemical vapor deposition, and a plurality of accommodating spaces 15 are formed. The material of the insulating layer 14 is usually silicon dioxide.

Then, referring to FIG. 2, the accommodating spaces 15 are filled with a conductive metal 16. The material of the conductive metal 16 is usually copper. Finally, the first surface 11 and the second surface 12 of the substrate 1 are ground or etched so as to expose the conductive metal 16, as shown in FIG. 3.

In the conventional method, the insulating layer 14 is formed by chemical vapor deposition, so that the thickness of the insulating layer 14 on the side wall of the grooves 13 is limited, and is usually under 0.5 µm. Moreover, the thickness of the insulating layer 14 on the side wall of the grooves 13 is not even, that is, the thickness of the insulating layer 14 on the upper side wall of the grooves 13 is not exactly equal to that on the lower side wall of the grooves 13. Thus, the electrical capacity is not uniform.

Therefore, it is necessary to provide a method for forming a via in a substrate to solve the above problems.

SUMMARY OF THE INVENTION

The present invention is directed to a method for forming a via in a substrate. The method comprises the following steps: (a) providing a substrate having a first surface and a second surface; (b) forming a groove that has a side wall and a bottom wall on the first surface of the substrate; (c) forming a conductive metal on the side wall and the bottom wall of the groove so as to form a central groove; (d) forming an annular groove that surrounds the conductive metal on the first surface of the substrate; (e) forming an insulating material in the central groove and the annular groove; and (f) removing part of the second surface of the substrate to expose the conductive metal and the insulating material.

The present invention is further directed to a method for forming a via in a substrate. The method comprises the following steps: (a) providing a substrate, the substrate comprising a substrate body and a circuit layer, the substrate body having a first surface and a second surface, the circuit layer being disposed on the second surface of the substrate body; (b) forming a groove that has a side wall and a bottom wall on the first surface of the substrate body, wherein the groove penetrates the substrate body and exposes the circuit layer; (c) forming a conductive metal on the side wall and the bottom wall of the groove so as to form a central groove, wherein the conductive metal contacts the circuit layer; (d) forming an annular groove that surrounds the conductive metal on the first surface of the substrate body; and (e) forming an insulating material in the central groove and the annular groove.

The present invention is further directed to a substrate with a via. The substrate with a via comprises a substrate, a conductive metal and an insulating material. The substrate comprised a substrate body and a circuit layer. The substrate body has a first surface, a second surface and a via. The via penetrates the substrate body. The circuit layer is disposed on the second surface of the substrate body. The conductive metal is disposed in the via. The conductive metal has an annular side portion and a bottom portion, wherein the annular side portion defines a central groove therein. An annular groove is formed between the annular side portion and the side wall of the via. The bottom portion contacts the circuit layer. The insulating material is disposed in the central groove and the annular groove.

In the present invention, thicker insulating material can be formed in the via. Also, the thickness of the insulating material in the via is even. Moreover, polymer is used as an insulating material in the present invention, so that polymers with different materials can be chosen for specific processes. Additionally, the insulating material in the central groove and the annular groove is formed simultaneously. Therefore, overall manufacture process of the substrate is simplified, and the manufacture cost is reduced.

DETAILED DESCRIPTION OF THE INVENTION

Figure 1:
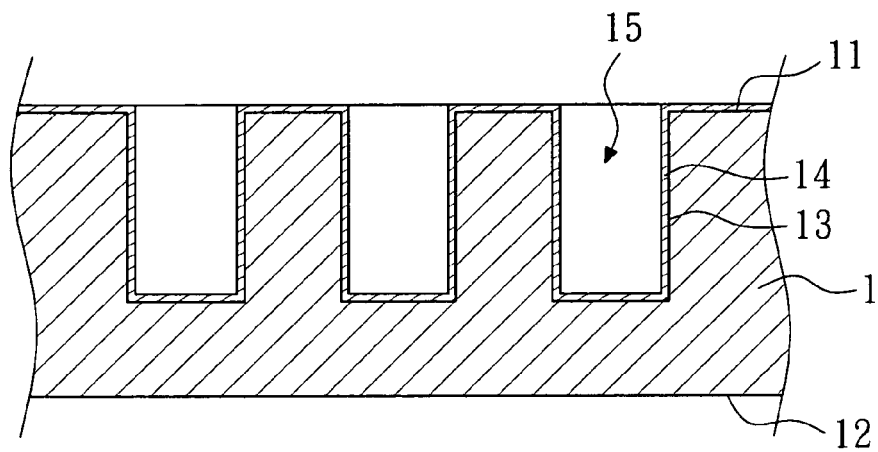
FIGS. 1 to 3 are schematic views of a conventional method for forming a via in a substrate.
Figure 2:
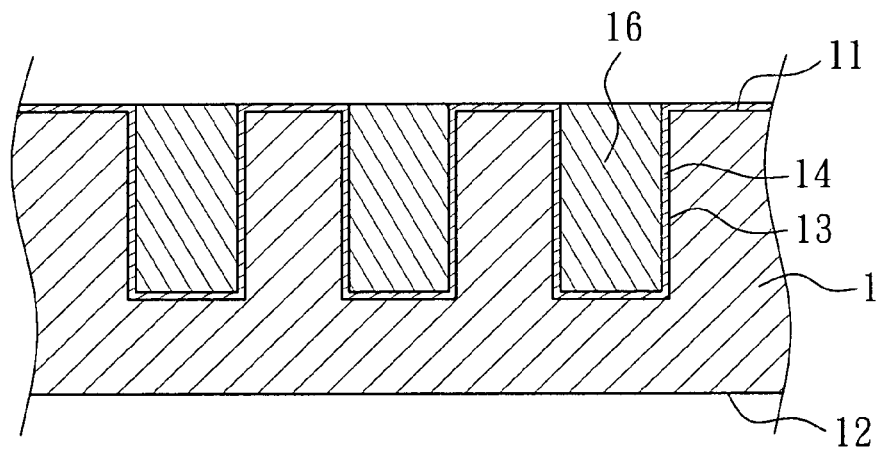
Figure 3:
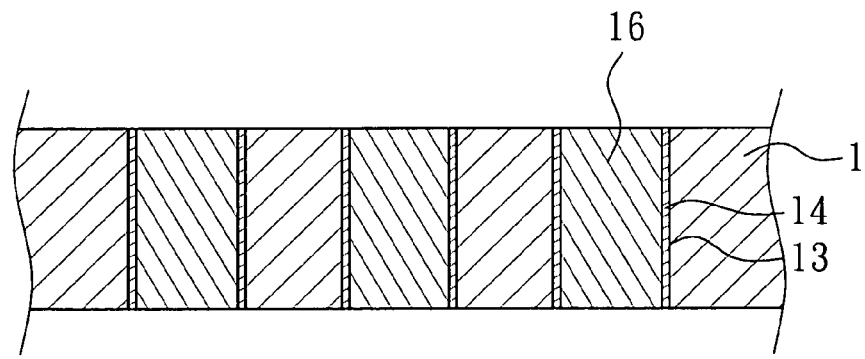
Figure 4:
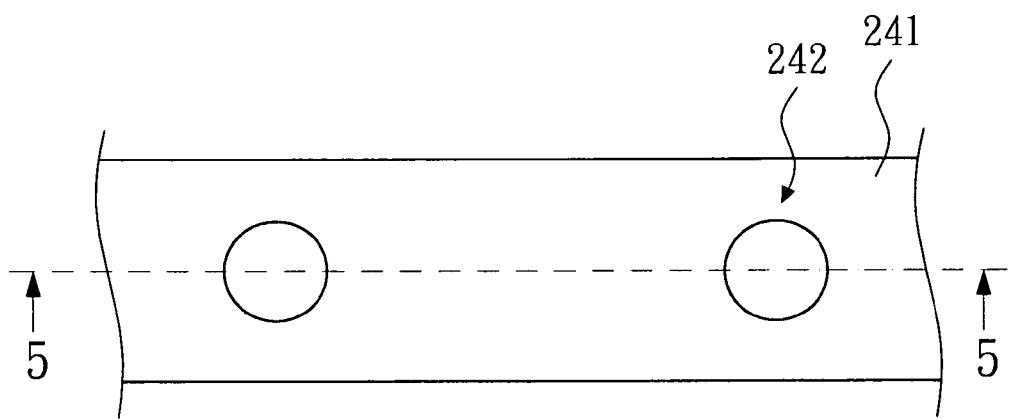
FIGS. 4 to 19 are schematic views of a method for forming a via in a substrate according to a first embodiment of the present invention.
Figure 5:
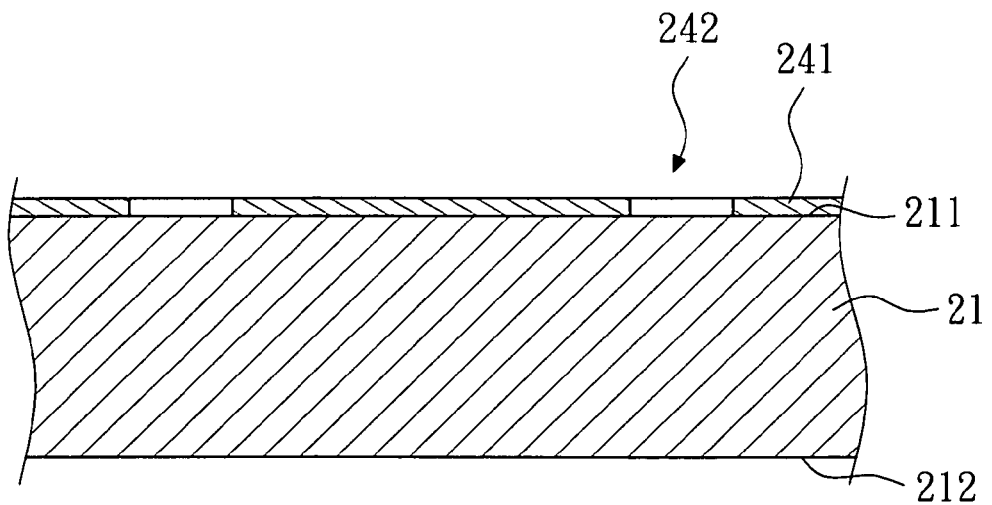

FIGS. 4 to 19 show schematic views of a method for forming a via in a substrate according to a first embodiment of the present invention. Referring to FIG. 4, a top view of the substrate, and FIG. 5, a cross-sectional view along line 5-5 in FIG. 4, first, a substrate 21 is provided. The substrate 21 has a first surface 211 and a second surface 212. The substrate 21 is, for example, a real wafer (functional wafer), a dummy wafer or a silicon substrate. Then, a groove 231 (FIG. 6) is formed on the first surface 211 of the substrate 21. The groove 231 has a side wall 232 and a bottom wall 233. In the embodiment, a first photo resist layer 241 is formed on the first surface 211 of the substrate 21, and a first opening 242 is formed on the first photo resist layer 241.

Figure 6:
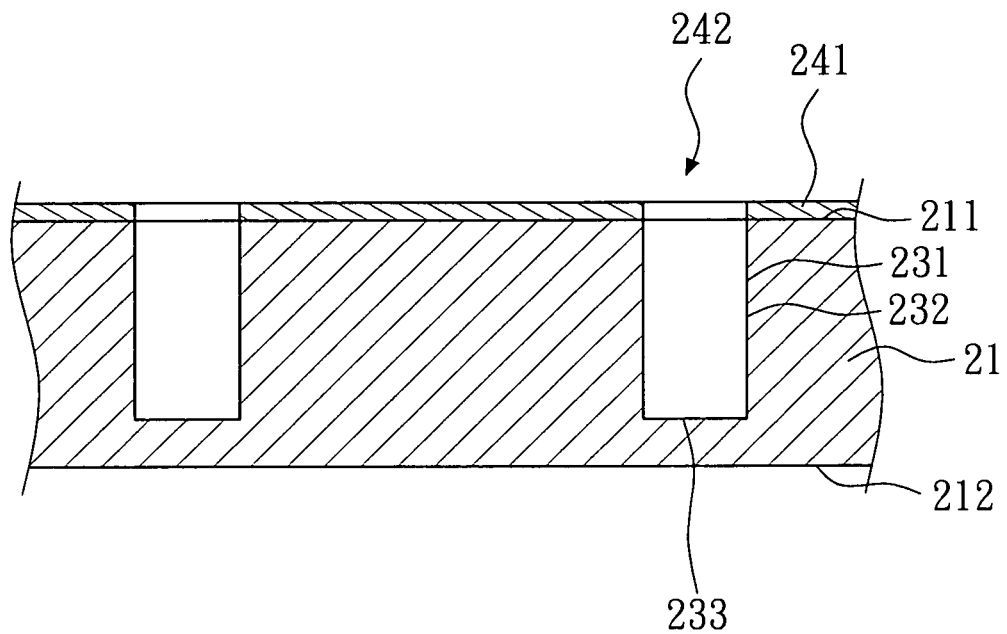

Referring to FIG. 6, the groove 231 is formed on the substrate 21 by etching according to the first opening 242. The groove 231 is disposed on the first surface 211 of the substrate 21, and has the side wall 232 and the bottom wall 233. The first photo resist layer 241 is then removed.

Figure 7:
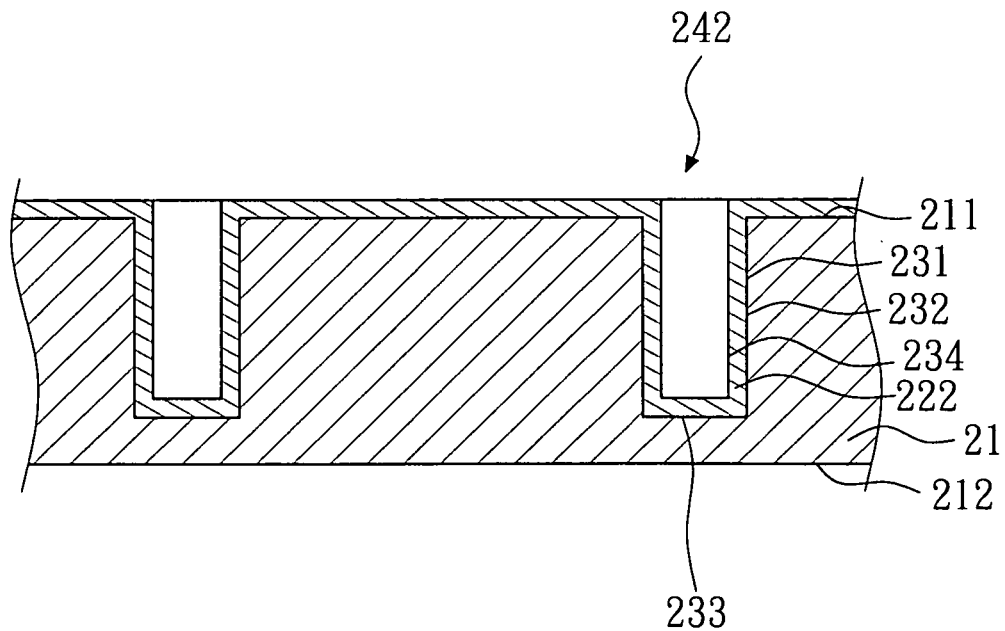

Referring to FIG. 7, a conductive metal 222 is formed on the side wall 232 and the bottom wall 233 of the groove 231 and the first surface 211 of the substrate 21 by electroplating, so as to form a central groove 234. In the embodiment, the material of the conductive metal 222 is copper, and the thickness of the conductive metal 222 is equal to or greater than 6 µm.

Figure 8:
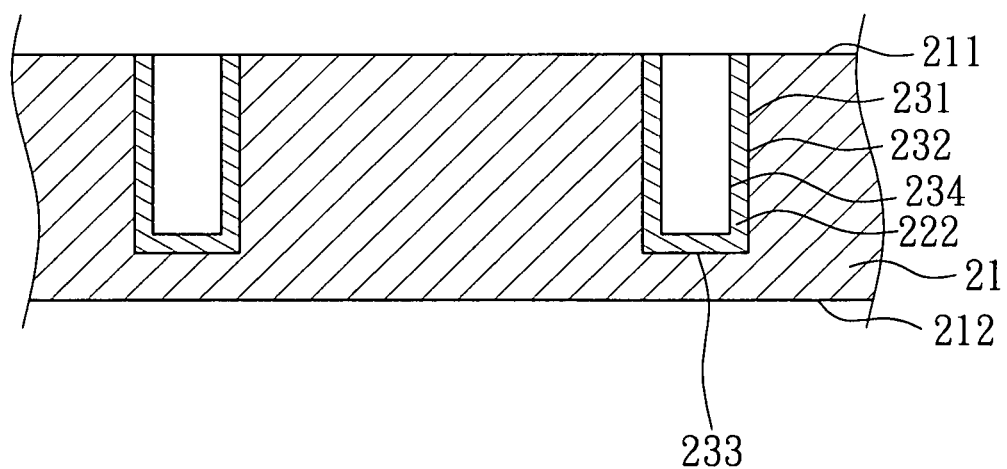

Then, referring to FIG. 8, the conductive metal 222 that is disposed on the first surface 211 of the substrate 21 is removed by etching or grinding.

Figure 9:
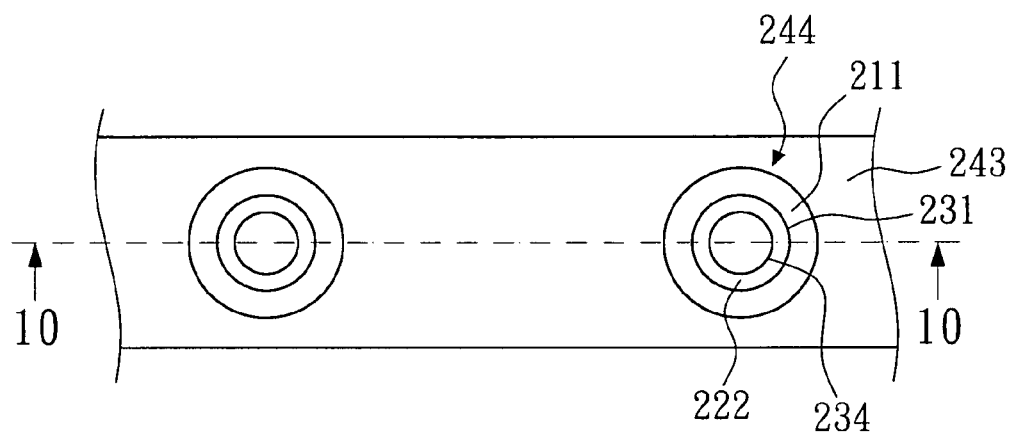
Figure 10:
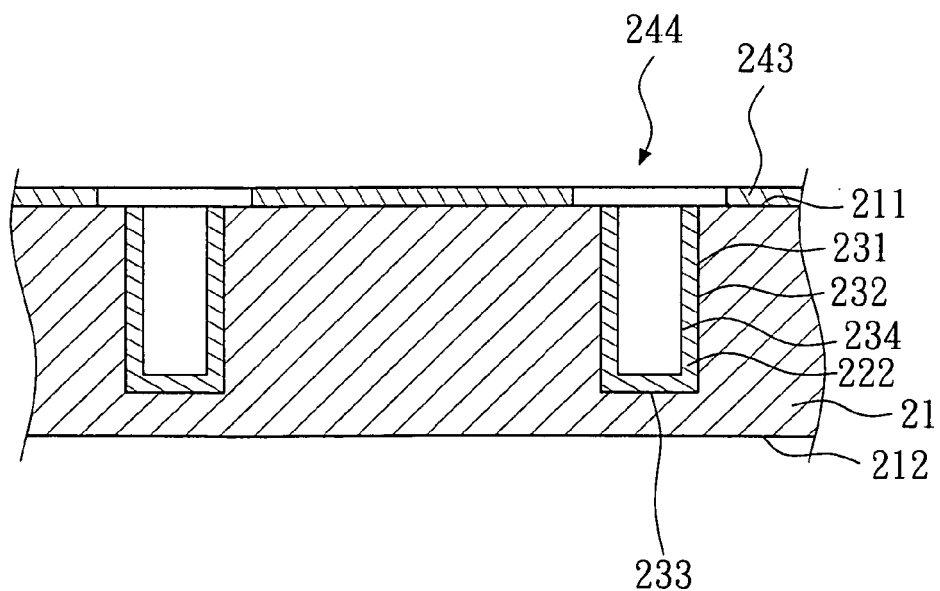
Figure 11:
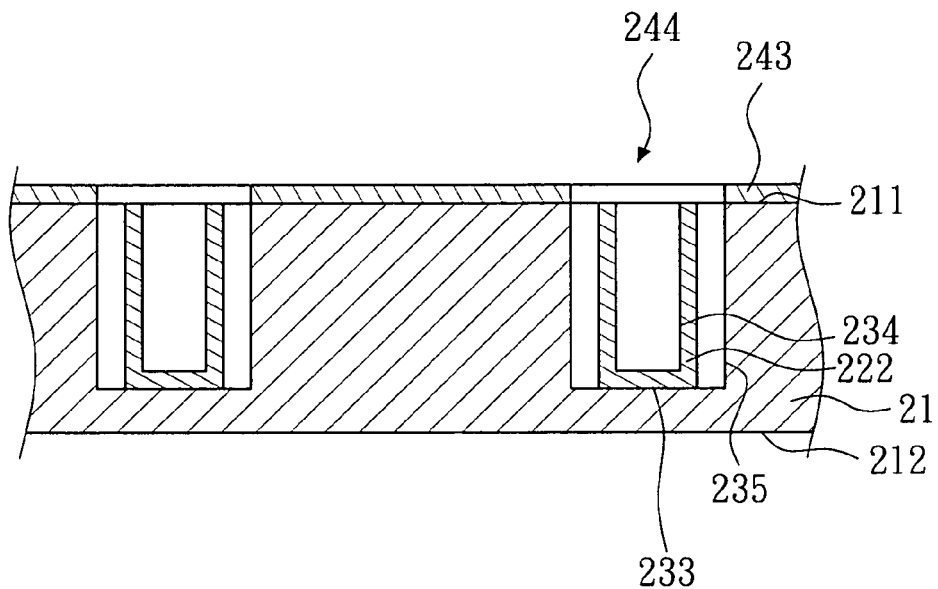

Referring to FIGS. 9 to 11, an annular groove 235 is formed on the first surface 211 of the substrate 21. The annular groove 235 surrounds the conductive metal 222 (FIG. 11). Referring to FIG. 9, a top view of the substrate, and FIG. 10, a cross-sectional view along line 10-10 in FIG. 9, in the embodiment, a second photo resist layer 243 is formed on the first surface 211 of the substrate 21, and a second opening 244 is formed on the second photo resist layer 243. The position of the second opening 244 corresponds to the groove 231, and the diameter of the second opening 244 is larger than that of the groove 231. Then, referring to FIG. 11, the annular groove 235 is formed on the substrate 21 by etching according to the second opening 244. The annular groove 235 surrounds the conductive metal 222, and does not penetrate through the substrate 21.

Figure 12:
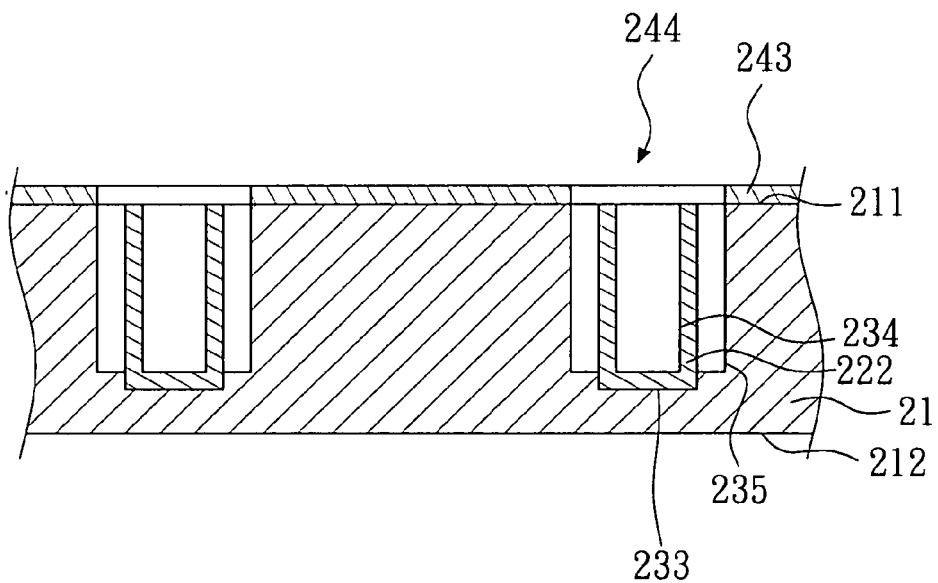

In the embodiment, the level of the bottom wall of the annular groove 235 is equal to that of the bottom portion of the conductive metal 222. That is, the depth of the annular groove 235 is equal to the height of the conductive metal 222. However, it is understood that the depth of the annular groove 235 may be less than the height of the conductive metal 222, so that the bottom portion of the conductive metal 222 is embedded in the substrate 21, as shown in FIG. 12.

Figure 13:
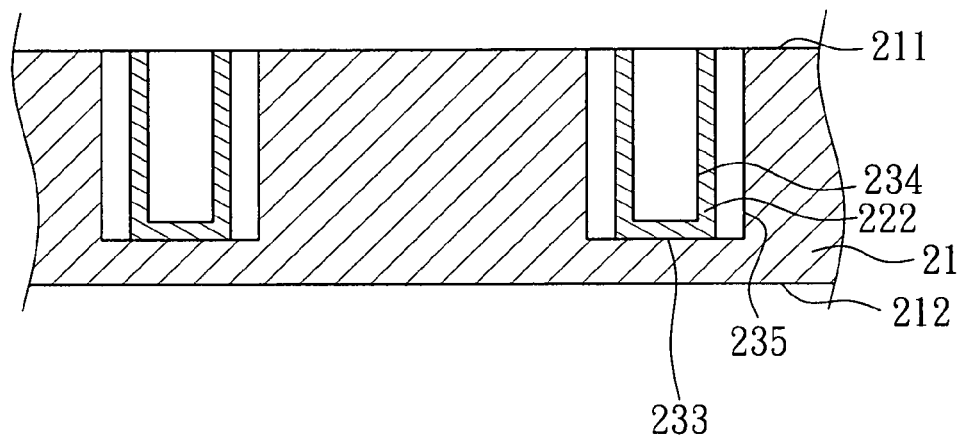

Referring to FIG. 13, the second photo resist layer 243 is then removed.

Then, referring to FIGS. 14 to 17, an insulating material 22 is formed in the central groove 234 and the annular groove 235. In the embodiment, the insulating material 22 is a polymer 263, and the thickness of the insulating material 22 in the annular groove 235 is 3 to 10 μm. In the present invention, the method for forming the insulating material 22 in the central groove 234 and the annular groove 235 includes but is not limited to the following three methods.

Figure 14:
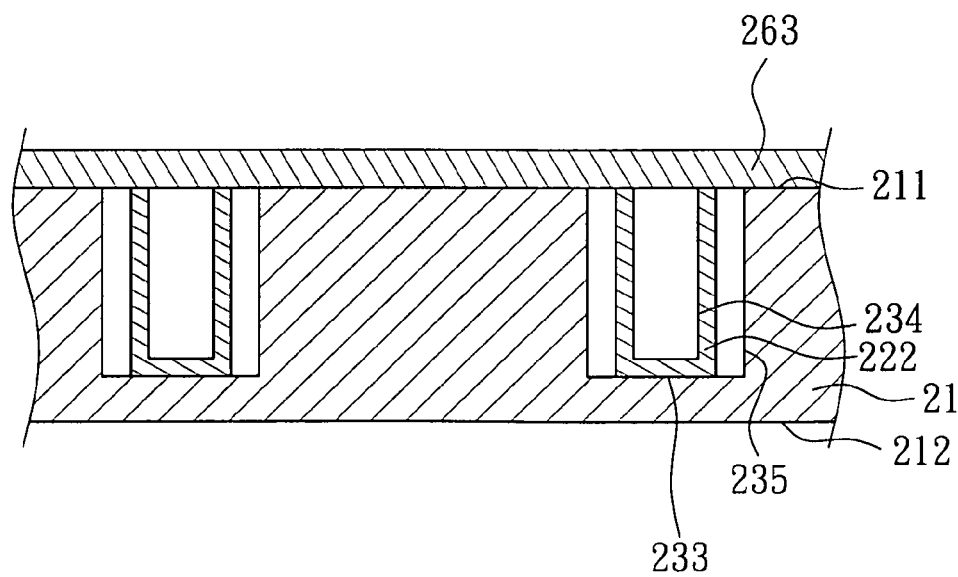
Figure 15:
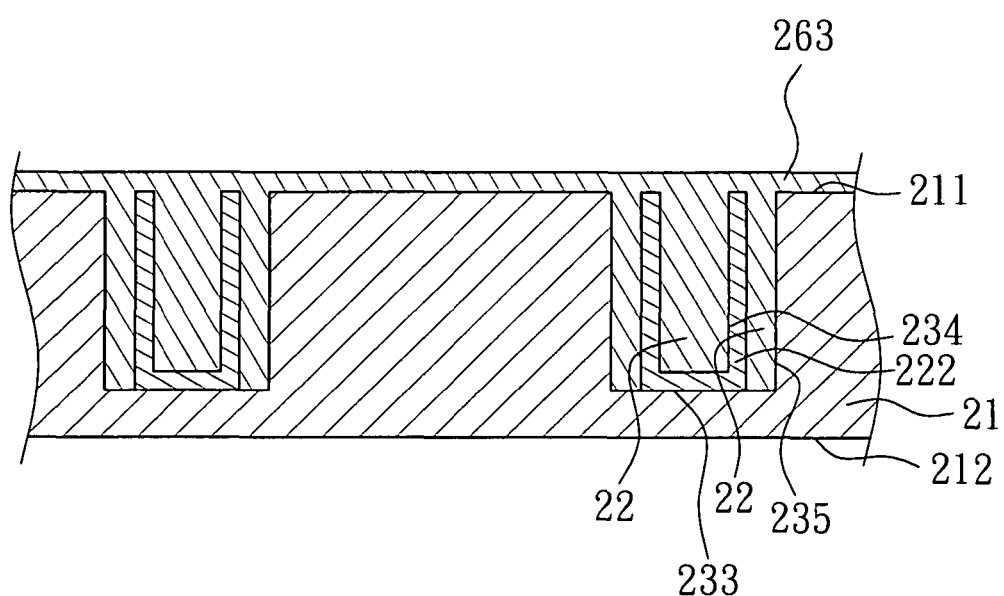

The first method is that the polymer 263 is dispersed on the first surface 211 of the substrate 21, and the position of the polymer 263 corresponds to the central groove 234 and the annular groove 235, as shown in FIG. 14. Alternatively, the polymer 263 can be partially dispersed at a position corresponding to the central groove 234 and the annular groove 235. Then, the polymer 263 is impelled into the central groove 234 and the annular groove 235 by vacuuming so as to form the insulating material 22, as shown in FIG. 15.

Figure 16:
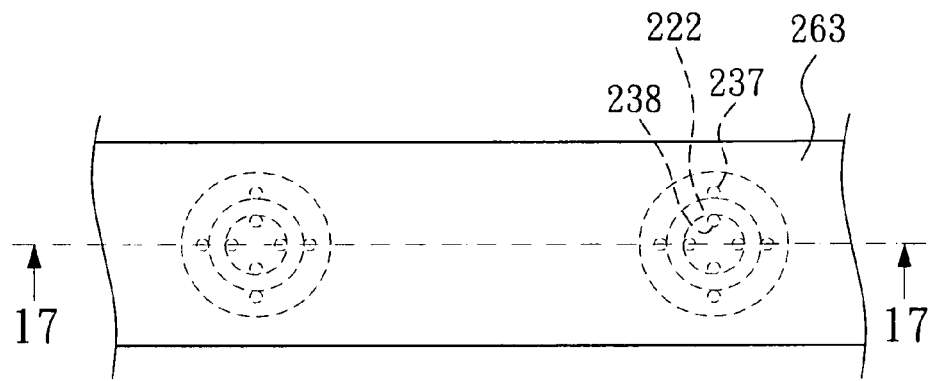
Figure 17:
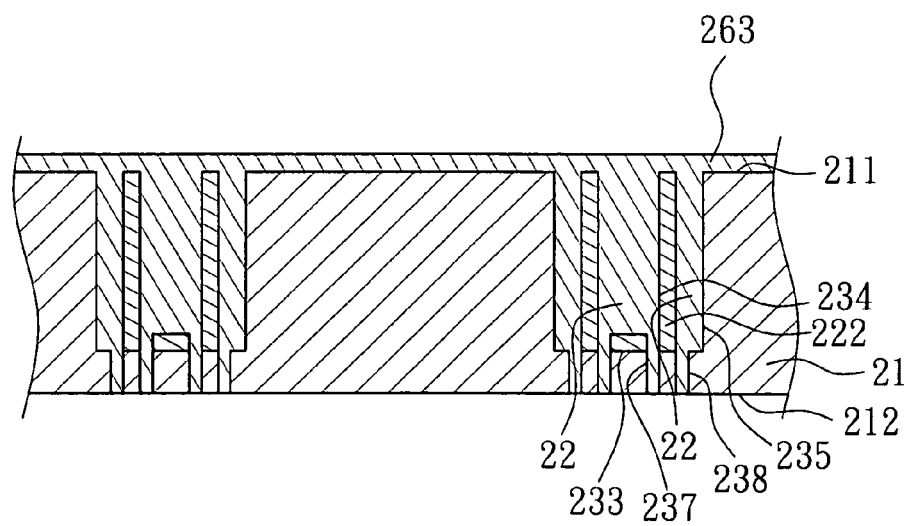

The second method is that a plurality of first vents 237 and a plurality of second vents 238 are formed, as shown in FIG. 16, a top view of the substrate 21, and FIG. 17, a cross-sectional view along line 17-17 in FIG. 16. The first vents 237 connect the central groove 234 and the second surface 212 of the substrate 21, and the second vents 238 connect the annular groove 235 and the second surface 212 of the substrate 21. Then, the polymer 263 is dispersed on the first surface 211 of the substrate 21, and the position of the polymer 263 corresponds to the central groove 234 and the annular groove 235. Alternatively, the polymer 263 can be partially dispersed at a position corresponding to the central groove 234 and the annular groove 235. The central groove 234, the annular groove 235, the first vents 237 and the second vents 238 are then filled with the polymer 263 so as to form the insulating material 22.

The third method is that the polymer 263 is atomized and deposited in the central groove 234 and annular groove 235 by spray coating so as to form the insulating material 22.

Figure 18:
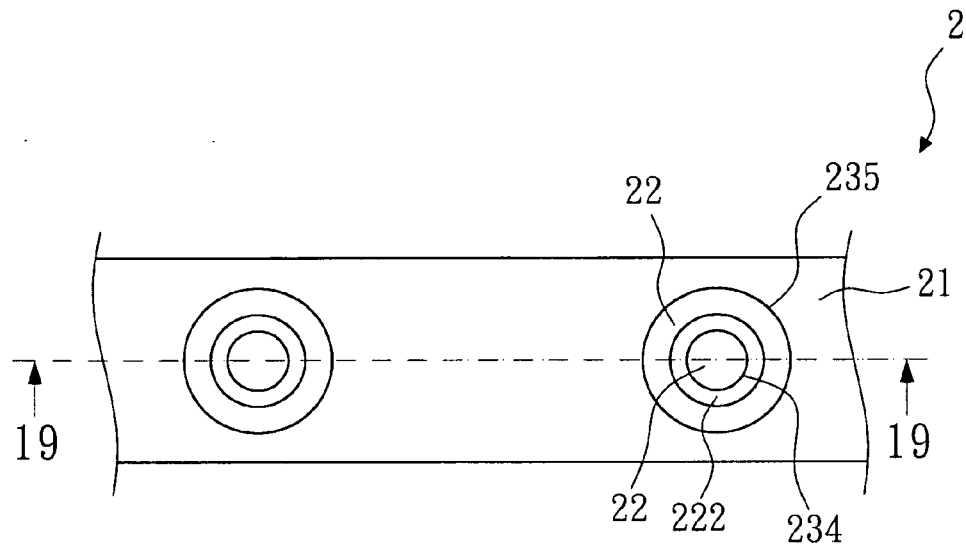
Figure 19:
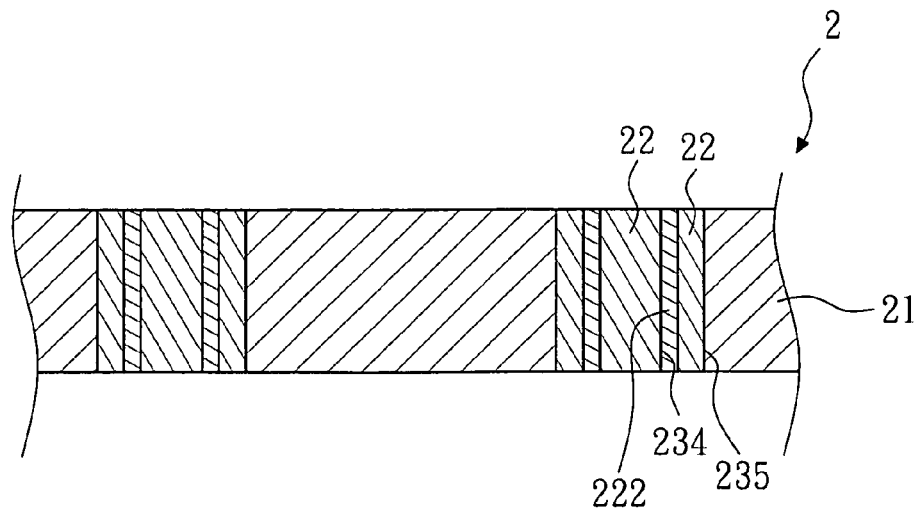

Then, referring to FIGS. 18 and 19, the insulating material 22 (the polymer 263) that is disposed on the first surface 211 of the substrate 21 is removed by etching or grinding the first surface 211 of the substrate 21. Alternatively, part of the first surface 211 and part of the second surface 212 of the substrate 21 are removed by etching or grinding so as to expose the conductive metal 222 and the insulating material 22. A substrate 2 with a via according to the first embodiment of the present invention is formed. In the embodiment, the via includes the insulating material 22 and the conductive metal 222.

Preferably, at least one redistribution layer (see e.g., FIG. 33) is formed on the first surface 211 or the second surface 212 of the substrate 21, or both of the first surface 211 and the second surface 212 of the substrate 21.

In the present invention, thicker insulating material 22 can be formed in the central groove 234 and the annular groove 235 of the via. Also, the thickness of the insulating material 22 in the central groove 234 and the annular groove 235 of the via is even. Moreover, the polymer 263 is used as an insulating material 22 in the present invention, so that polymers with different materials can be chosen for specific processes. Additionally, the insulating material 22 in the central groove 234 and the annular groove 235 is formed simultaneously. That is, the insulating material 22 in the central groove 234 and the annular groove 235 is formed at a same step, so that a manufacture step is omitted. Therefore, overall manufacture process of the substrate 2 is simplified, and the manufacture cost is reduced.

Figure 20:
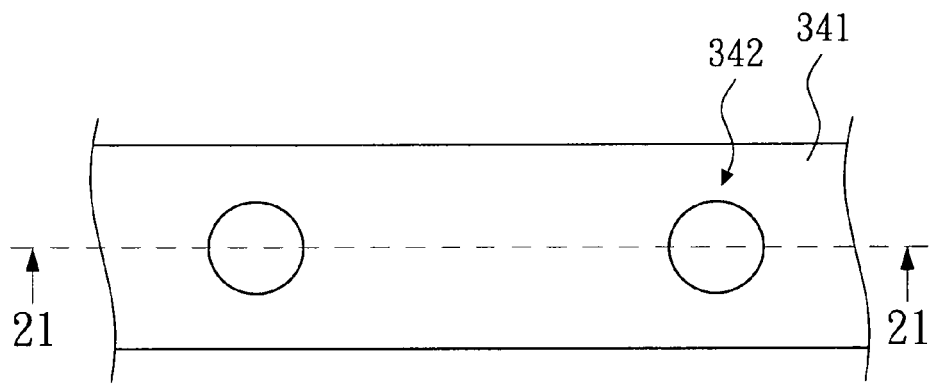
FIGS. 20 to 33 are schematic views of a method for forming a via in a substrate according to a second embodiment of the present invention.
Figure 21:
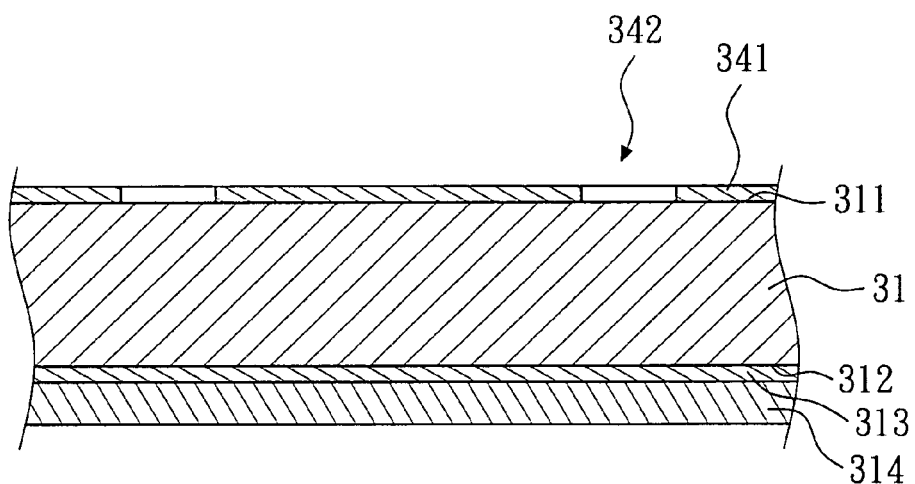

FIGS. 20 to 33 show schematic views of a method for forming a via in a substrate according to a second embodiment of the present invention. Referring to FIG. 20, a top view of the substrate, and FIG. 21, a cross-sectional view along line 21-21 in FIG. 20, first, a substrate is provided. The substrate is a real wafer (functional wafer) which comprises a substrate body 31 and a circuit layer 314. The substrate body 31 has a first surface 311 and a second surface 312, and the circuit layer 314 is disposed on the second surface 312 of the substrate body 31. Preferably, the substrate further comprises a protection layer 313 (e.g., an oxide layer) that is disposed between the circuit layer 314 and the second surface 312 of the substrate body 31.

Then, a groove 331 (FIG. 22) is formed on the first surface 311 of the substrate body 31. The groove 331 has a side wall 332 and a bottom wall 333. In the embodiment, a first photo resist layer 341 is formed on the first surface 311 of the substrate body 31, and a first opening 342 is formed on the first photo resist layer 341.

Figure 22:
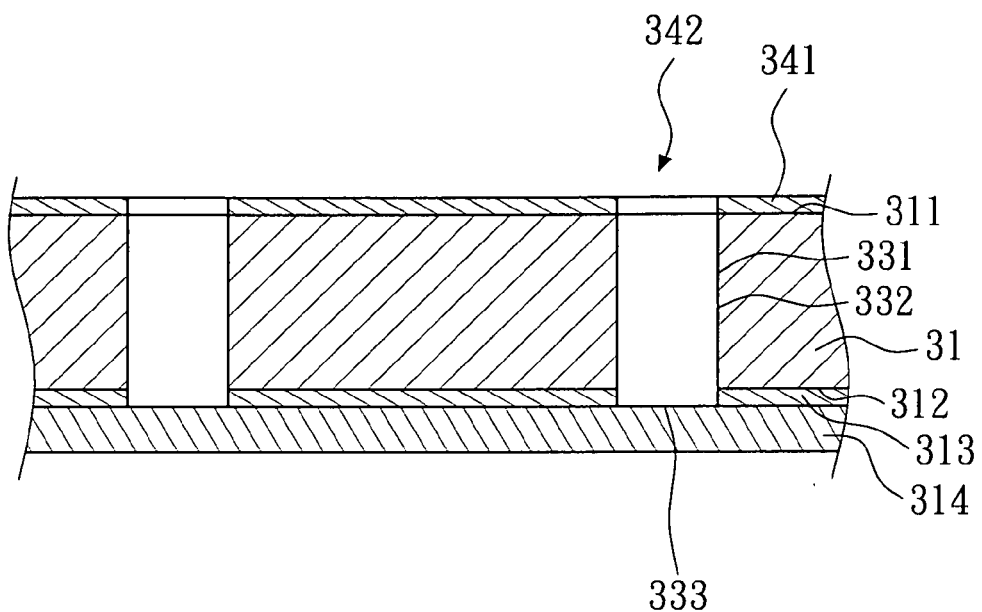

Referring to FIG. 22, the groove 331 is formed on the substrate body 31 by etching according to the first opening 342. The groove 331 is disposed on the first surface 311 of the substrate body 31, and has the side wall 332 and the bottom wall 333. The groove 331 penetrates the substrate body 31 and the protection layer 313, and exposes the circuit layer 314. The first photo resist layer 341 is then removed.

Figure 23:
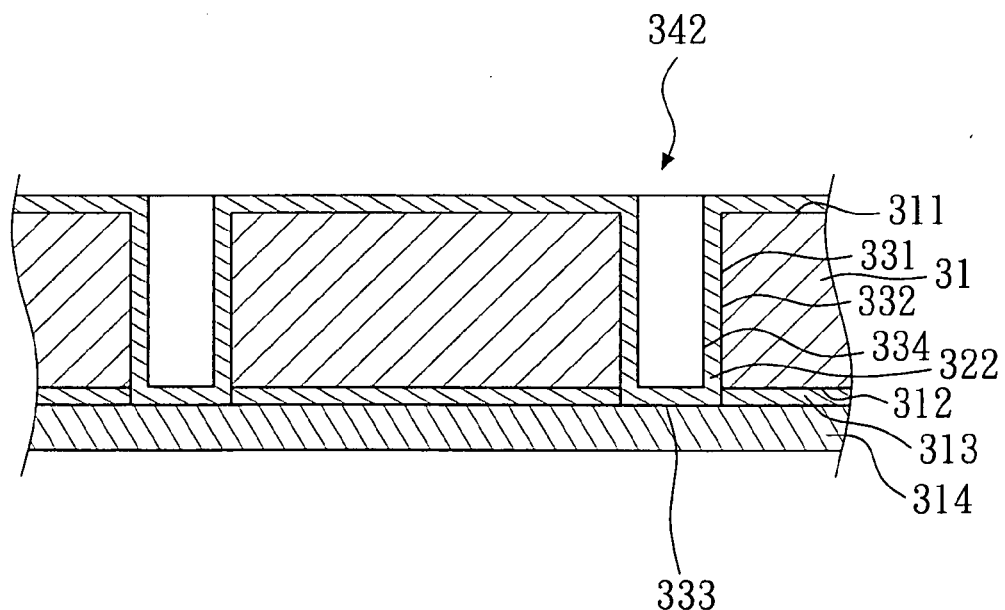

Referring to FIG. 23, a conductive metal 322 is formed on the side wall 332 and the bottom wall 333 of the groove 331 and the first surface 311 of the substrate body 31 by electroplating, so as to form a central groove 334. The conductive metal 322 contacts the circuit layer 314. In the embodiment, the material of the conductive metal 322 is copper, and the thickness of the conductive metal 322 is equal to or greater than 6 μm.

Figure 24:
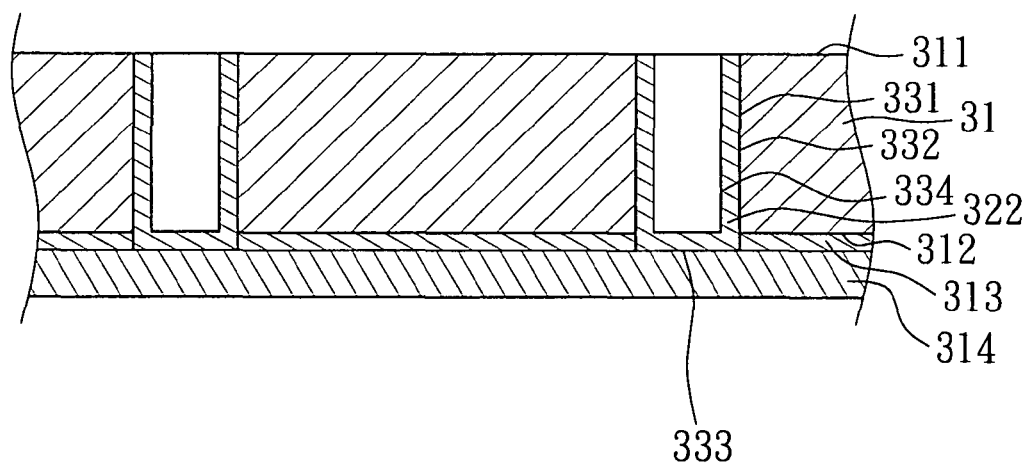

Then, referring to FIG. 24, the conductive metal 322 that is disposed on the first surface 311 of the substrate body 31 is removed by etching or grinding.

Figure 25:
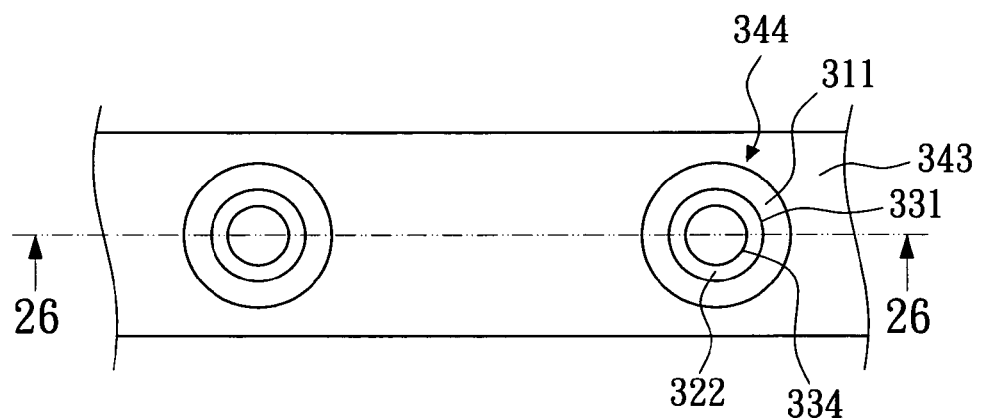
Figure 26:
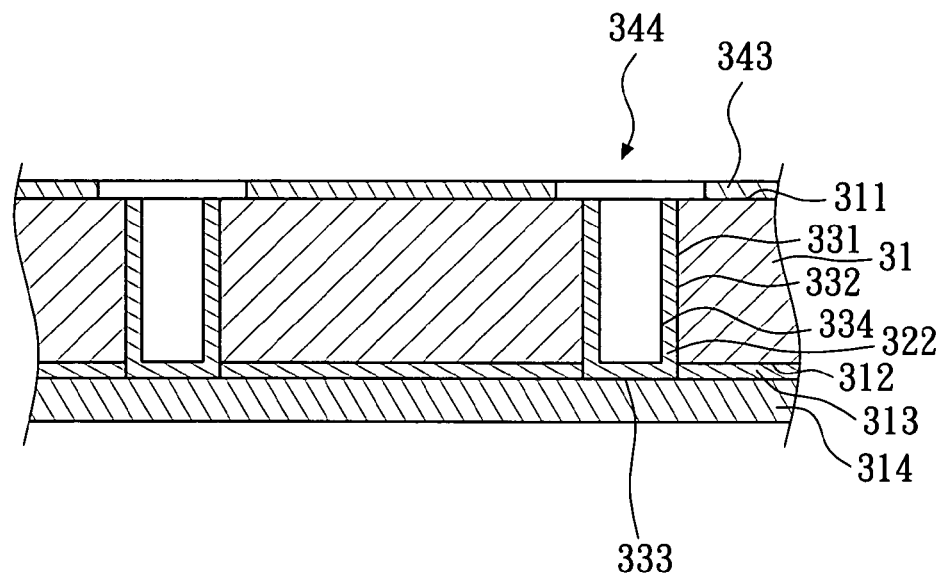
Figure 27:
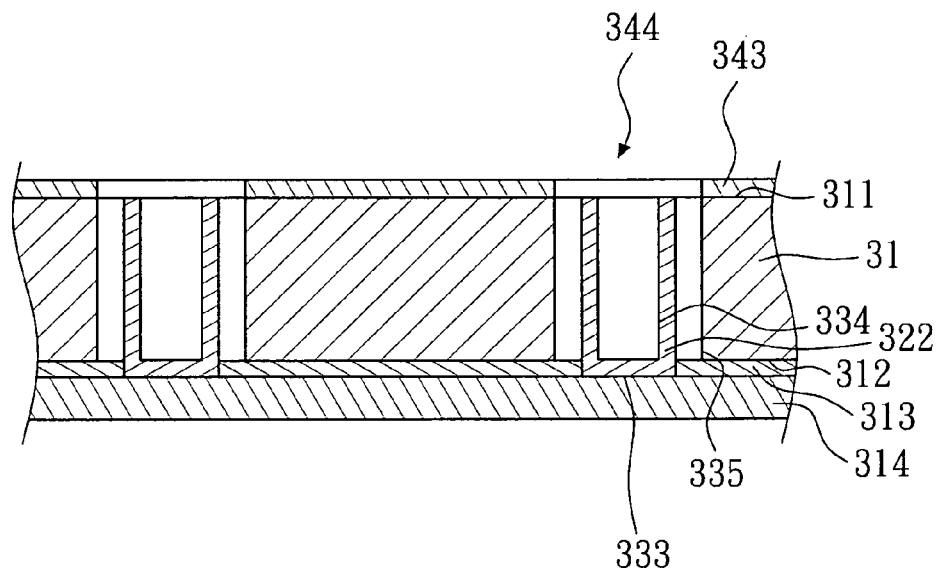

Referring to FIGS. 25 to 27, an annular groove 335 is formed on the first surface 311 of the substrate body 31. The annular groove 335 surrounds the conductive metal 322 (FIG. 27). Referring to FIG. 25, a top view of the substrate, and FIG. 26, a cross-sectional view along line 26-26 in FIG. 25, in the embodiment, a second photo resist layer 343 is formed on the first surface 311 of the substrate body 31, and a second opening 344 is formed on the second photo resist layer 343. The position of the second opening 344 corresponds to the groove 331, and the diameter of the second opening 344 is larger than that of the groove 331. Then, referring to FIG. 27, the annular groove 335 is formed on the substrate body 31 by etching according to the second opening 344. The annular groove 335 surrounds the conductive metal 322. In the embodiment, the annular groove 335 penetrates the substrate body 31, but does not penetrate the protection layer 313.

Figure 28:
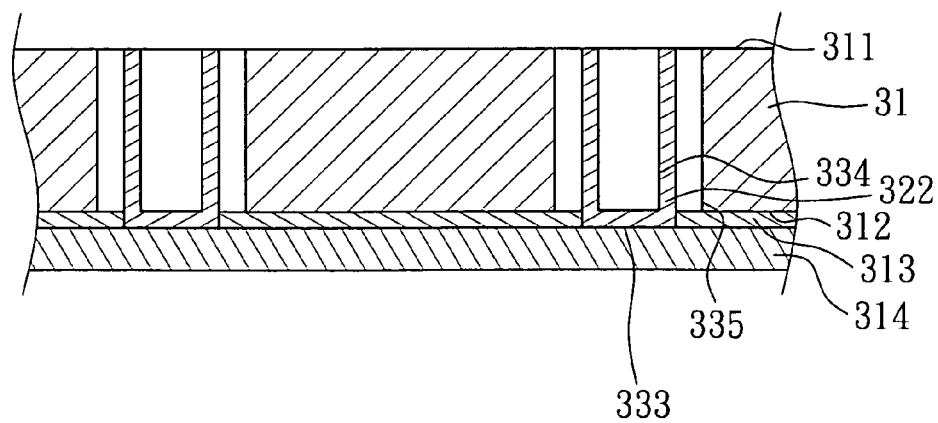

Referring to FIG. 28, the second photo resist layer 343 is then removed.

Figure 29:
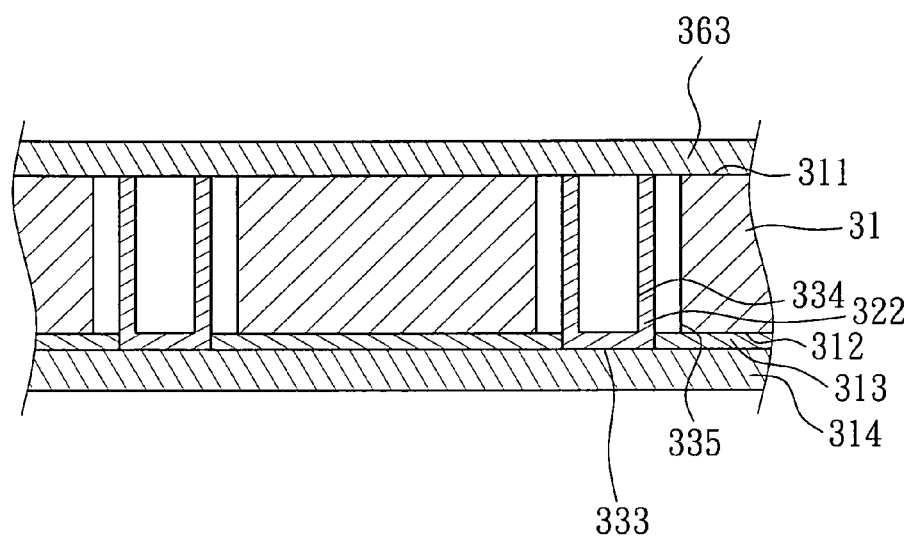
Figure 30:
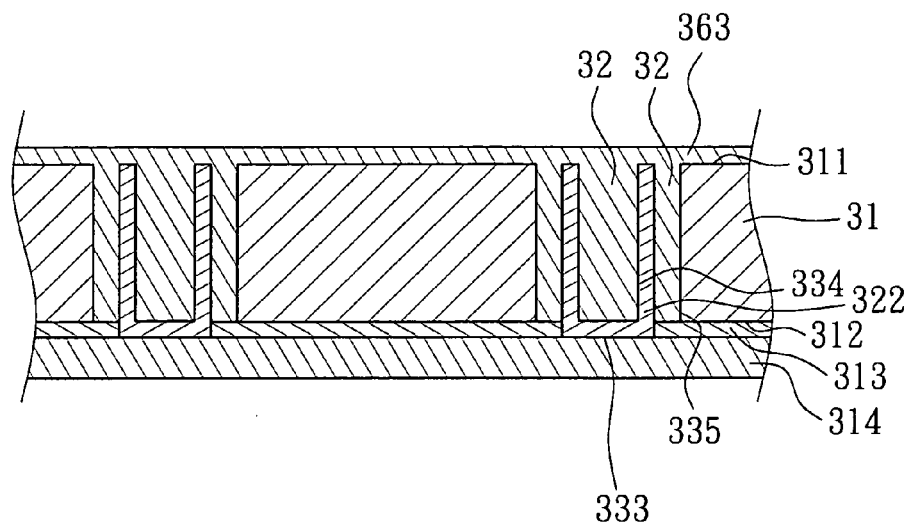

Then, referring to FIGS. 29 to 30, an insulating material 32 is formed in the central groove 334 and the annular groove 335. In the embodiment, the insulating material 32 is a polymer 363, and the thickness of the insulating material 32 in the annular groove 335 is 3 to 10 μm. In the present invention, the method for forming the insulating material 32 in the central groove 334 and the annular groove 335 includes but is not limited to the following two methods.

The first method is that the polymer 363 is dispersed on the first surface 311 of the substrate body 31, and the position of the polymer 363 corresponds to the central groove 334 and the annular groove 335, as shown in FIG. 29. Alternatively, the polymer 363 can be partially dispersed at a position corresponding to the central groove 334 and the annular groove 335. Then, the polymer 363 is impelled into the central groove 334 and the annular groove 335 by vacuuming so as to form the insulating material 32, as shown in FIG. 30.

The second method is that the polymer 363 is atomized and deposited in the central groove 334 and annular groove 335 by spray coating so as to form the insulating material 32.

Figure 31:
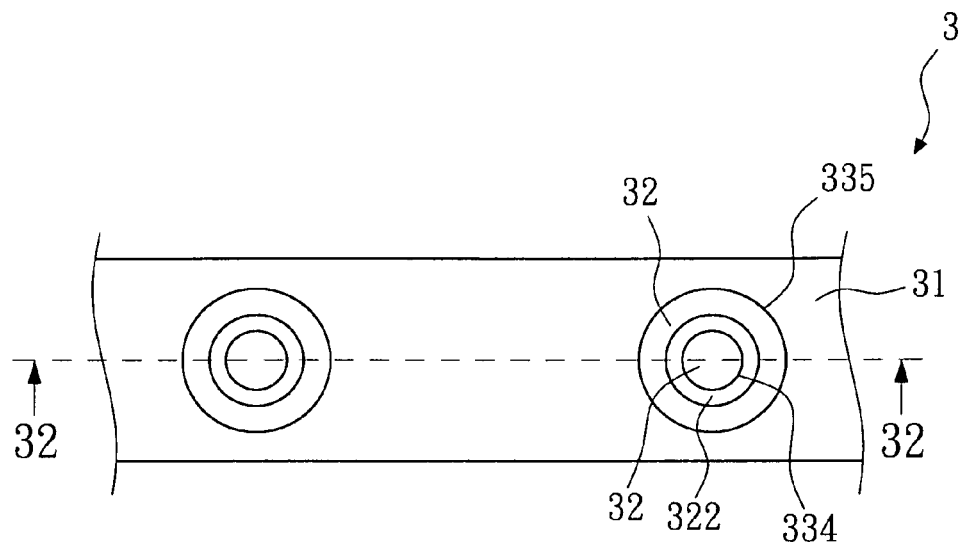
Figure 32:
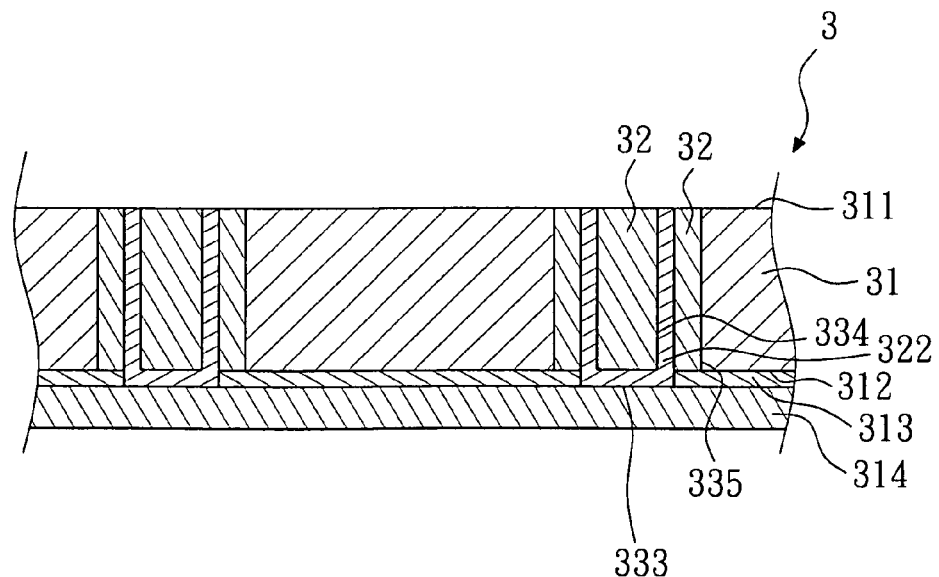

Then, referring to FIGS. 31 and 32, the insulating material 32 (the polymer 363) that is disposed on the first surface 311 of the substrate body 31 is removed by etching or grinding the first surface 311 of the substrate body 31. A substrate 3 with a via according to the second embodiment of the present invention is formed. In the embodiment, the via includes the insulating material 32 and the conductive metal 322.

Preferably, the method further comprises the following steps: forming a passivation layer (see, e.g., FIG. 33) on the first surface 311 of the substrate body 31; forming an opening on the passivation layer; and forming a redistribution layer (see, e.g., FIG. 33) on the first surface 311 of the substrate body 31 and in the opening. However, it is understood that if the polymer 363 (FIG. 30) is photosensitive, the insulating material 32 (the polymer 363) that is disposed on the first surface 311 of the substrate body 31 is not necessary to be removed. Then, an opening is formed on the polymer 363, and a redistribution layer 37 is formed in the opening, as shown in FIG. 33.

Figure 33:
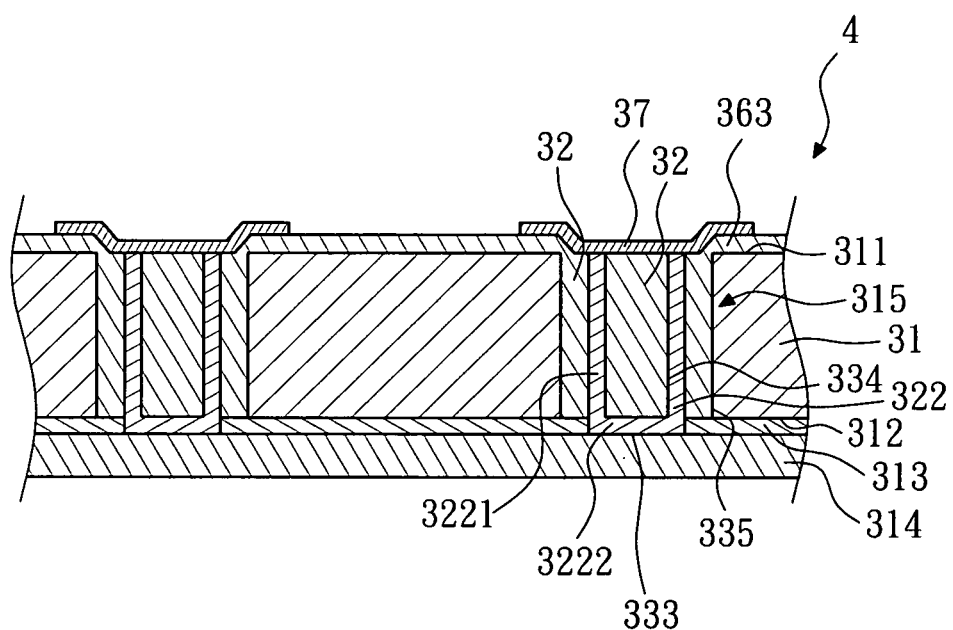

FIG. 33 shows a schematic view of a substrate with a via according to a second embodiment of the present invention. The substrate 4 with a via comprises a substrate, a conductive metal 322 and an insulating material 32. The substrate comprises a substrate body 31 and a circuit layer 314. The substrate body 31 has a first surface 311, a second surface 312 and a via 315. The via 315 penetrates the substrate body 31. The circuit layer 314 is disposed on the second surface 312 of the substrate body 31.

The conductive metal 322 is disposed in the via 315. The conductive metal 322 has an annular side portion 3221 and a bottom portion 3222, wherein the annular side portion 3221 defines a central groove 334 therein. An annular groove 335 is formed between the annular side portion 3221 of the conductive metal 322 and the side wall of the via 315, and the bottom portion 3222 of the conductive metal 322 contacts the circuit layer 314. In the embodiment, the material of the conductive metal 322 is copper, and the thickness of the conductive metal 322 is equal to or greater than 6 μm.

The insulating material 32 is disposed in the central groove 334 and the annular groove 335. In the embodiment, the insulating material 32 is a polymer 363, and the thickness of the insulating material 32 in the annular groove 335 is 3 to 10 μm.

Preferably, the substrate 4 further comprises a protection layer 313 (e.g., an oxide layer) and a redistribution layer 37. The protection layer 313 is disposed between the circuit layer 314 and the second surface 312 of the substrate body 31, and the conductive metal 322 penetrates the protection layer 313.

The redistribution layer 37 is disposed on the first surface 311 of the substrate body 31, wherein the redistribution layer 37 contacts the conductive metal 322. In the embodiment of FIG. 33, the polymer 363 can be photosensitive and has an opening. The redistribution layer 37 is disposed in the opening.

However, it is understood that if the polymer 363 is not photosensitive, the insulating material 32 (the polymer 363) that is disposed on the first surface 311 of the substrate body 31 must be removed. Then, a passivation layer 38 is formed on the first surface 311 of the substrate body 31, an opening is formed on the passivation layer 38, and a redistribution layer 37 is formed on the first surface 311 of the substrate body 31 and in the opening. Therefore, the substrate further comprises the passivation layer disposed on the first surface 311 of the substrate body 31, wherein the passivation layer has an opening, and the redistribution layer is disposed in the opening.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method for forming a via in a substrate, comprising:
   (a) providing a substrate having a first surface and a second surface;
   (b) forming a groove that has a side wall and a bottom wall on the first surface of the substrate;
   (c) forming a conductive metal on the side wall and the bottom wall of the groove so as to form a central groove;
   (d) forming an annular groove that surrounds the conductive metal on the side wall and the bottom wall of the groove;
   (e) forming an insulating material in the central groove and the annular groove; and
   (f) removing part of the second surface of the substrate to expose the conductive metal and the insulating material.

2. The method as claimed in claim 1, wherein Step (b) comprises:
   (b1) forming a first photo resist layer on the first surface of the substrate;
   (b2) forming a first opening on the first photo resist layer; and
   (b3) forming the groove on the substrate according to the first opening.

3. The method as claimed in claim 1, further comprising a step of removing the conductive metal that is disposed on the first surface of the substrate after step (c).

4. The method as claimed in claim 1, wherein Step (d) comprises:
   (d1) forming a second photo resist layer on the first surface of the substrate;

(d2) forming a second opening on the second photo resist layer so that the position of the second opening corresponds to the groove, and the diameter of the second opening is larger than that of the groove; and (d3) forming the annular groove on the substrate according to the second opening.

5. The method as claimed in claim 1, wherein in Step (d), the annular groove does not penetrate through the substrate.

6. The method as claimed in claim 1, wherein in Step (d), the depth of the annular groove is equal to the height of the conductive metal.

7. The method as claimed in claim 1, wherein in Step (d), the depth of the annular groove is less than the height of the conductive metal.

8. The method as claimed in claim 1, wherein Step (e) comprises:
   (e1) dispersing a polymer at a position corresponding to the central groove and the annular groove; and
   (e2) impelling the polymer into the central groove and the annular groove by vacuuming so as to form the insulating material.

9. The method as claimed in claim 1, wherein Step (e) comprises:
   (e1) forming a plurality of first vents and a plurality of second vents, wherein the first vents connect the central groove and the second surface of the substrate, and the second vents connect the annular groove and the second surface of the substrate;
   (e2) dispersing a polymer at a position corresponding to the central groove and the annular groove; and
   (e3) filling the central groove, the annular groove, the first vents and the second vents with the polymer so as to form the insulating material.

10. The method as claimed in claim 1, further comprising a step of removing the insulating material that is disposed on the first surface of the substrate after step (e).

11. The method as claimed in claim 1, further comprising a step of forming at least one redistribution layer on one of or both of the first surface and the second surface of the substrate after step (f).

12. A method for forming a via in a substrate, comprising:
   (a) providing a substrate, the substrate comprising a substrate body and a circuit layer, the substrate body having a first surface and a second surface, the circuit layer being disposed on the second surface of the substrate body;
   (b) forming a groove on the first surface of the substrate body, wherein the groove has a side wall and a bottom wall, penetrates the substrate body and exposes the circuit layer;
   (c) forming a conductive metal on the side wall and the bottom wall of the groove so as to form a central groove, wherein the conductive metal contacts the circuit layer;
   (d) forming an annular groove that surrounds the conductive metal on the side wall and the bottom wall of the groove; and
   (e) forming an insulating material in the central groove and the annular groove.

13. The method as claimed in claim 12, wherein Step (b) comprises:
   (b1) forming a first photo resist layer on the first surface of the substrate body;
   (b2) forming a first opening on the first photo resist layer; and
   (b3) forming the groove on the substrate body according to the first opening, 14. The method as claimed in claim 12, further comprising a step of removing the conductive metal that is disposed on the first surface of the substrate body after step (c).

15. The method as claimed in claim 12, wherein Step (d) comprises:
   (d1) forming a second photo resist layer on the first surface of the substrate body;
   (d2) forming a second opening on the second photo resist layer so that the position of the second opening corresponds to the groove, and the diameter of the second opening is larger than that of the groove; and
   (d3) forming the annular groove on the substrate body according to the second opening.

16. The method as claimed in claim 12, wherein Step (e) comprises:
   (e1) dispersing a polymer at a position corresponding to the central groove and the annular groove; and
   (e2) impelling the polymer into the central groove and the annular groove by vacuuming so as to form the insulating material.

17. The method as claimed in claim 12, further comprising a step of removing the insulating material that is disposed on the first surface of the substrate body after step (e).

18. The method as claimed in claim 12, further comprising a step of forming a redistribution layer on the first surface of the substrate body after step (e).

* * * * *